United States Patent [19]
Hayashi

[11] Patent Number: 5,087,585
[45] Date of Patent: Feb. 11, 1992

[54] METHOD OF STACKING SEMICONDUCTOR SUBSTRATES FOR FABRICATION OF THREE-DIMENSIONAL INTEGRATED CIRCUIT

[75] Inventor: Yoshihiro Hayashi, Tokyo, Japan

[73] Assignee: NEC Corporation, Tokyo, Japan

[21] Appl. No.: 551,095

[22] Filed: Jul. 11, 1990

[30] Foreign Application Priority Data

Jul. 11, 1989 [JP] Japan .................................. 1-179268

[51] Int. Cl.$^5$ ...................................... H01L 21/98
[52] U.S. Cl. ...................................... 437/51; 437/915; 437/974
[58] Field of Search ................. 437/51, 915, 974, 180; 148/DIG. 135

[56] References Cited

U.S. PATENT DOCUMENTS

| | | |
|---|---|---|
| 4,266,334 | 5/1981 | Edwards et al. ...................... 437/974 |
| 4,317,125 | 2/1982 | Hughes et al. ...................... 437/974 |
| 4,321,613 | 3/1982 | Hughes et al. ...................... 437/974 |
| 4,339,870 | 7/1982 | Ball et al. ............................... 437/51 |
| 4,465,549 | 8/1984 | Ritzman ................................. 437/974 |
| 4,612,083 | 9/1986 | Yasumoto et al. .................. 437/915 |
| 4,818,728 | 4/1989 | Rai et al. ............................... 437/974 |
| 4,902,637 | 2/1990 | Kondov et al. ........................ 437/51 |
| 4,980,308 | 12/1990 | Hayashi et al. ....................... 437/41 |

FOREIGN PATENT DOCUMENTS

| | | |
|---|---|---|
| 0052582 | 4/1977 | Japan ..................................... 437/974 |
| 0048950 | 3/1984 | Japan ..................................... 437/974 |

Primary Examiner—Olik Chaudhuri
Assistant Examiner—M. Wilczewski
Attorney, Agent, or Firm—Sughrue, Mion, Zinn, Macpeak & Seas

[57] ABSTRACT

A semiconductor substrate stacking method comprises the steps of preparing first and second thin film devices each in the form of a thin film having a connection electrode formed on an upper surface thereof and a connection electrode formed on an undersurface thereof, each of the thin film devices being bonded at its upper surface thereof to a support plate by adhesive. The first thin film device is stacked and bonded onto a base substrate having a device formed thereon and a connection electrode formed on the device, in such a manner that the device formed on the base substrate faces the undersurface of the first thin film device and the connection electrode formed on the device formed on the base substrate is in alignment with and in contact with the undersurface connection electrode formed on the first thin film device. The support plate and the adhesive of the first thin film device are removed so that the upper surface of the first thin film device and the upper surface connection electrode formed on the upper surface of the first thin film device are exposed. Similarly, the second thin film device is stacked and bonded onto the first thin film device stacked on the base substrate and the support plate and the adhesive of the second thin film device is removed.

6 Claims, 3 Drawing Sheets

METHOD OF STACKING SEMICONDUCTOR SUBSTRATES FOR FABRICATION OF THREE-DIMENSIONAL INTEGRATED CIRCUIT

BACKGROUND OF THE INVENTION

1. Field of the Invention

The present invention relates to a method for stacking semiconductor substrates, and more specifically to a method for sequentially stacking a plurality of thin film devices on a semiconductor substrate.

2. Description of Related Art

One conventional method for fabricating a three-dimensional LSI (large scaled integrated circuit) is composed of mutually bonding or laminating semiconductor substrates each of which includes thereon devices such as MOS transistors (Masaaki YASUMOTO et al, "Semiconductor World." 5., pp 1-8). In this method, more specifically, there are first prepared a pair of semiconductor substrates, each of which comprises a device layer in which one or more devices have already formed and a plurality of connection electrodes formed of for example gold bumps deposited on the device layer. Thereafter, the pair of semiconductor substrates are aligned to each other in such a manner that the device layer of one semiconductor substrate faces the device layer of the other semiconductor substrate and the connection electrodes formed on the device layer of one semiconductor substrate are in alignment with the corresponding connection electrodes formed on the device layer of the other semiconductor substrate, and the pair of semiconductor substrates thus aligned to each other are bonded to each other so as to form a three-dimensional LSI of a double layer structure.

However, the above mentioned stacking method as it is cannot form a device having three or more device layers. If one dares to stack three or more device layers by utilizing the above mentioned method, it would be necessary to remove a substrate portion of a selected one of the pair of stacked semiconductor substrates so as to leave only the device layer and the connection electrodes formed on the selected semiconductor substrate by selectively polishing a rear side of the selected semiconductor substrate (Tsuneo HAMAGUCHI et al, "Applied Physics" 56[11], pp 1480, 1987). As a result, a rear face of the device layer, which had been formed on the selected semiconductor substrate before the removal of the selected semiconductor substrate, is exposed, and connection electrodes are formed on the exposed rear face of the device layer for connection with a third device layer. As seen from the above, in order to interconnect three or more device layers by using the above mentioned method, it is necessary to polish a semiconductor substrate having two or more stacked device layers so as to thin the semiconductor substrate. However, there is a fear that a stress acting in the process of polishing acts on the connection electrode to generate a defective connection.

SUMMARY OF THE INVENTION

Accordingly, it is an object of the present invention to provide a method for stacking semiconductor substrates which has overcome the above mentioned defect of the conventional one.

Another object of the present invention is to provide a method for stacking three or more semiconductor substrates without polishing and thinning a substrate.

The above and other objects of the present invention are achieved in accordance with the present invention by a semiconductor substrate stacking method comprising the steps of:

preparing first and second thin film devices each in the form of a thin film having an upper surface connection electrode formed on an upper surface thereof and an undersurface connection electrode formed on an undersurface thereof, each of the thin film devices being bonded at its upper surface thereof to a support plate by adhesive;

stacking and bonding the first thin film device onto a base substrate having a device formed thereon and a connection electrode formed on the device, in such a manner that the device formed on the base substrate faces the undersurface of the first thin film device and the connection electrode formed on the device formed on the base substrate is in alignment with and in contact with the undersurface connection electrode formed on the first thin film device;

removing the support plate and the adhesive of the first thin film device so that the upper surface of the first thin film device and the upper surface connection electrode formed on the the upper surface of the first thin film device are exposed;

stacking and bonding the second thin film device onto the first thin film device stacked on the base substrate, in such a manner that the device formed on the first thin film device faces the undersurface of the second thin film device and the upper surface connection electrode formed on the device formed on the first thin film device is in alignment with and in contact with the undersurface connection electrode formed on the second thin film device; and removing the support plate and the adhesive of the second thin film device so that the upper surface of the second thin film device and the upper surface connection electrode formed on the the upper surface of the second thin film device are exposed.

In a preferred embodiment, the preparation of each of the first and second thin film devices includes the steps of:

forming a device on a semiconductor substrate;

forming the upper surface connection electrode on an upper surface of the device formed on the semiconductor substrate;

bonding the support plate, by adhesive, on the upper surface of the device formed on the semiconductor substrate and the upper surface connection electrode formed on the upper surface of the device formed on the semiconductor substrate;

thinning the semiconductor substrate by removing the semiconductor substrate from an undersurface of the semiconductor substrate so as to form the thin film device composed of a remaining portion of the substrate in which the device is formed;

forming an undersurface insulative layer on an undersurface of the thin film device; and forming an opening in the undersurface insulative layer; and forming the undersurface connection electrode on the undersurface of the thin film device exposed within the opening.

The above and other objects, features and advantages of the present invention will be apparent from the following description of preferred embodiments of the invention with reference to the accompanying drawings.

DESCRIPTION OF THE PREFERRED EMBODIMENTS

Now, explanation will be made on the case for stacking three device layers each formed on a silicon substrate. The process for stacking semiconductor substrates in accordance with the present invention is divided into a process for preparing a stacking thin film device and a process for stacking the thin film devices.

Referring to FIGS. 1A to 1E, there are shown diagrammatic sectional views for illustrating one embodiment of a process for preparing a stacking thin film device used in the semiconductor substrate stacking method in accordance with the present invention.

Figure 1A:
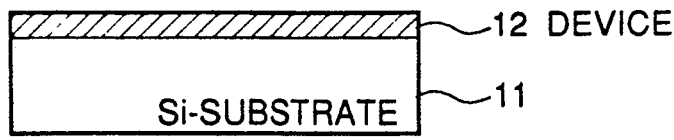
FIGS. 1A to 1E are diagrammatic sectional views for illustrating one embodiment of a process for preparing a stacking thin film device used in the semiconductor substrate stacking method in accordance with the present invention.
Figure 1B:
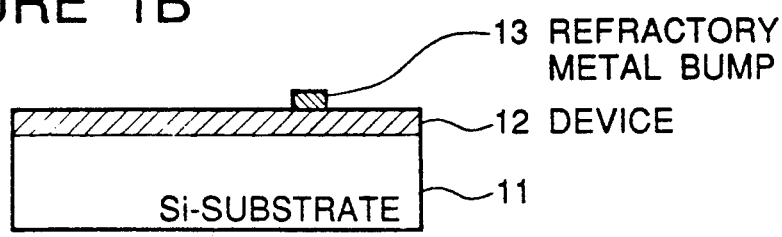
Figure 1C:
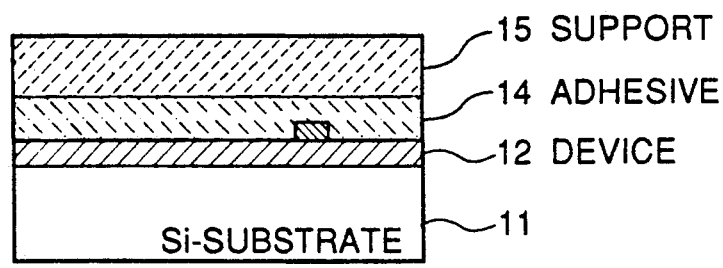

In the process for preparing a stacking thin film device, a device 12 is formed on a silicon substrate 11 as shown in FIG. 1A in accordance with an ordinary LSI fabrication process. A layer or portion of the silicon substrate in which the device 12 is formed is often called a "device layer" in this specification. Then, a bump 13 of a refractory metal such as tungsten is formed onto the device 12 as an upper surface connection electrode, as shown in FIG. 1B. A support plate 15 such as a silicon substrate is bonded to the device layer 12 by means of an organic adhesive 14, as shown in FIG. 1C.

Figure 1D:
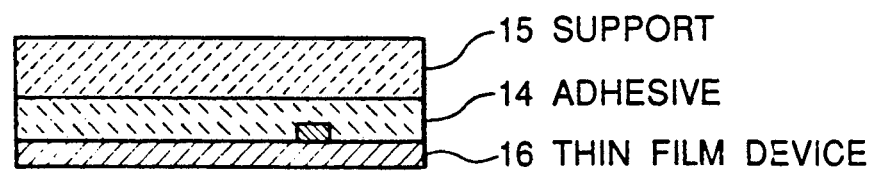
Figure 1E:
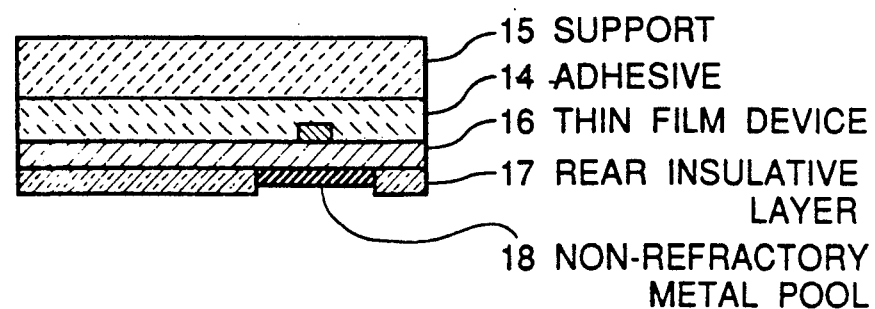

Thereafter, the substrate 11 is polished from its undersurface by a selective polishing so that an under portion of the substrate 11 excluding the device layer 12 is substantially removed. Thus, a thin film device 16 can be obtained as shown in FIG. 1D. In this condition, since the thin film device 16 is adhered to the support plate 15, there is no fear that the thin film device 16 is mechanically or electrically broken. Thereafter, an insulative layer 17 of for example $SiO_2$ is formed on an under or exposed surface of the thin film device 16, and an opening is formed in the rear insulative layer 17. The opening is larger in size than a corresponding upper surface refractory metal bump 13. A non-refractory metal is filled to the opening formed in the rear insulative layer 17 so as to form, as an undersurface connection electrode, a non-refractory metal pool 18 larger in size than the corresponding upper surface refractory metal bump 13, as shown in FIG. 1E. The non-refractory metal used is required to have a melting point substantially lower than that of the refractory metal bump 13, and preferably, a low melting point metal such as indium (In) is used. In this embodiment, the non-refractory metal pool 18 is formed of indium. The non-refractory metal pool 18 larger in size than the corresponding upper surface refractory metal bump 13 will make it possible to ensure electric interconnection between the stacked thin film devices even under some degree of misalignment between the stacked thin film devices.

With the above mentioned process, two thin film devices each having the connection electrode on its upper surface and the connection electrode on its undersurface are prepared. The thin film devices thus prepared are sequentially stacked on a first layer thin film device formed on a first semiconductor substrate in accordance with the thin film device stacking process, which will be explained hereinafter.

Referring to FIGS. 2A to 2G, there are shown diagrammatic sectional views for illustrating the semiconductor substrate stacking process in accordance with the present invention.

Figure 2A:
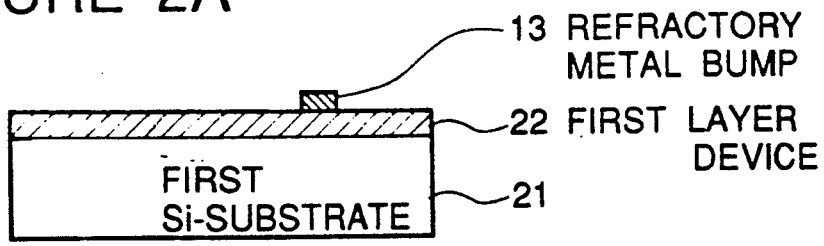
FIGS. 2A to 2G are diagrammatic sectional views for illustrating one embodiment of the semiconductor substrate stacking method in accordance with the present invention.

As shown in FIG. 2A, a first layer thin film device 22 is formed on a first silicon substrate 21, and a refractory metal bump 13 is formed on the first layer thin film device 22 as an upper surface connection electrode.

Figure 2B:
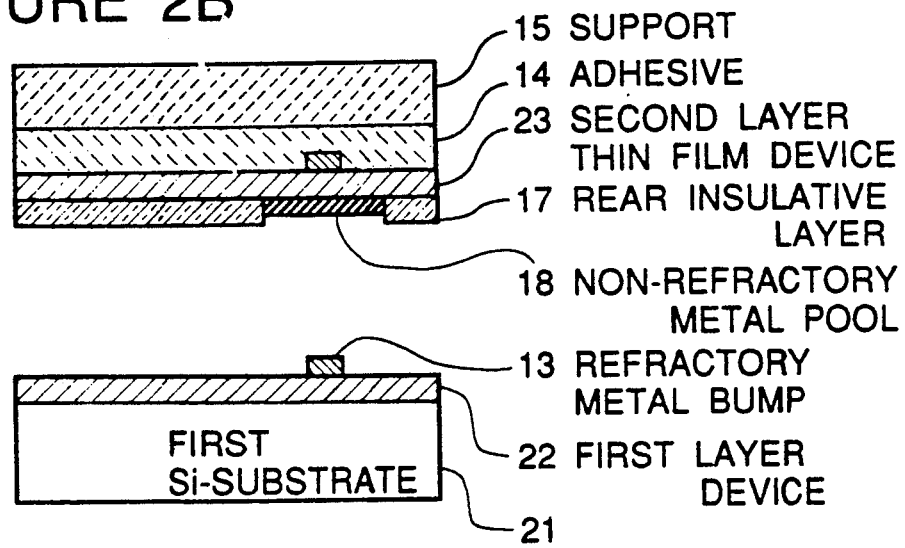

As shown in FIG. 2B, a second layer thin film device 23, which was prepared in the stacking thin film device preparing process as shown in FIGS. 1A to 1E, is positioned above the first layer thin film device 22 in such a manner that a non-refractory metal pool 18 formed on the undersurface of the second layer thin film device 23 is opposed to and aligned with the refractory metal bump 13 formed on the first layer thin film device 22. This positioning can be performed by using an infrared microscope capable of seeing through the support plate 15 (the silicon plate in this embodiment).

Figure 2C:
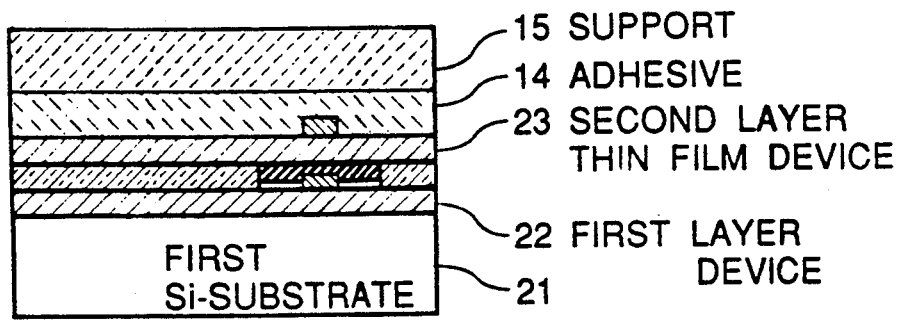

Thereafter, the first layer thin film device 22 and the second layer thin film device 23 are bonded to each other until the refractory metal bump 13 formed on the first layer thin film device 22 cuts into and electrically contacts with the non-refractory metal pool 18 formed on the undersurface of the second layer thin film device 23, as shown in FIG. 2C. In this bonding process, the devices are heated to a temperature higher than the melting point of the metal embedded as the nonrefractory metal pool 18, for example to 200° C. to 300° C. in the case of the indium pool 18.

Figure 2D:
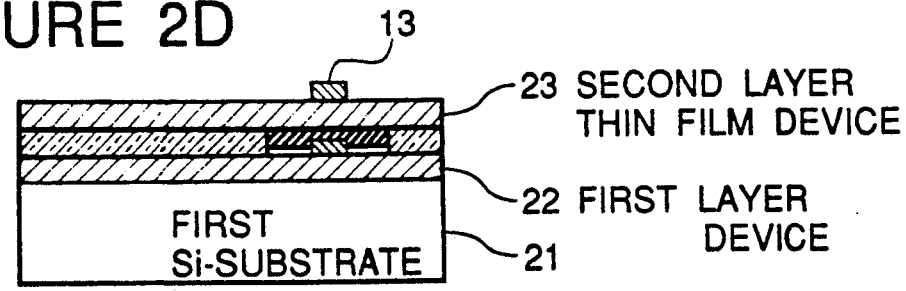

Then, the support plate 15 is removed by etching, and the adhesive 14 is also removed by oxygen plasma etching, so that the second layer thin film device 23 and the refractory metal bump 13 formed thereon are exposed as shown in FIG. 2D.

Figure 2E:
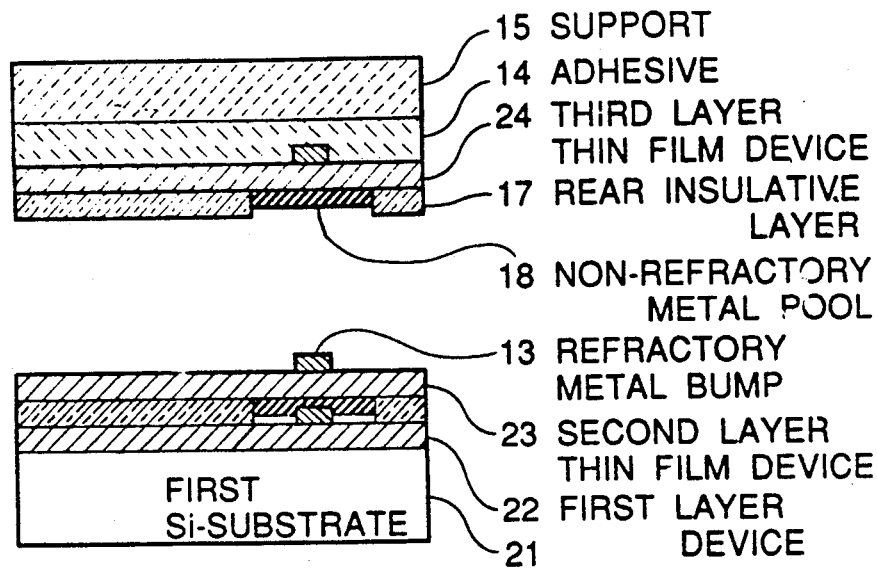

Thereafter, a third layer thin film device 24, which was prepared in the stacking thin film device preparing process as shown in FIGS. 1A to 1E, is positioned above the second layer thin film device 23 in such a manner that a non-refractory metal pool 18 formed on the undersurface of the third layer thin film device 24 is opposed to and aligned with the refractory metal bump 13 formed on the second layer thin film device 23, as shown in FIG. 2E.

Figure 2F:
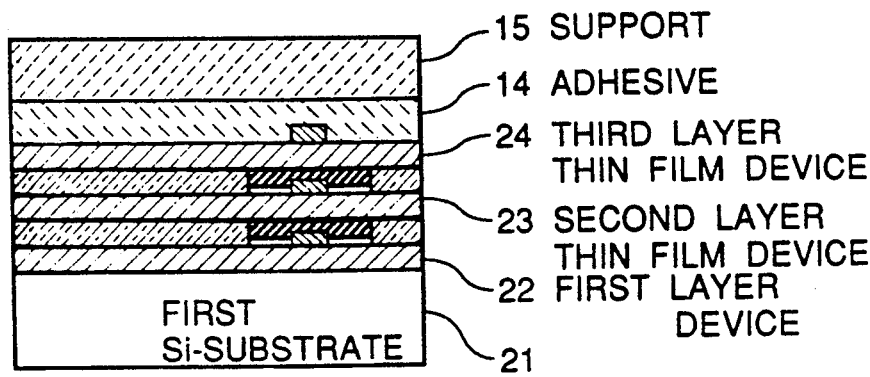
Figure 2G:
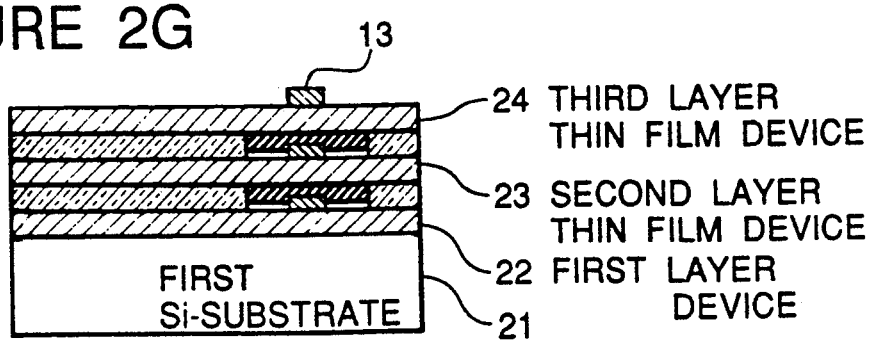

Thereafter, the third layer thin film device 24 and the second layer thin film device 23 are bonded to each other until the refractory metal bump 13 formed on the second layer thin film device 23 cuts into and electrically contacts with the non-refractory metal pool 18 formed on the undersurface of the third layer thin film device 24, as shown in FIG. 2F. Then, the support plate 15 of the third thin film device 24 is removed by etching, and the adhesive 14 of the third thin film device 24 is also removed by oxygen plasma etching, so that the third thin film device 24 and the refractory metal bump 13 formed thereon are exposed as shown in FIG. 2G.

With the above mentioned process, there is obtained the layered three-dimensional devices in which the first layer thin film device, the second layer thin film device and the third layer thin film device are connected to one another.

In the above mentioned embodiment, the layered device having three stacked layers has been formed. However, it would be apparent to be able to stack four or more thin film devices.

In the above mentioned embodiment, in addition, a refractory metal bump and a non-refractory metal pool are respectively formed on an upper surface and an undersurface of each thin film device as connection electrodes, and a bump-pool brazing is performed for interconnection between each pair of thin film devices. However, other interconnection manners, for example, a heat-press bonding between a metal bump and a metal bump can be used.

Furthermore, it would be apparent that the present invention can be applied to stacking of devices formed on semiconductor substrates other than a silicon substrate and also of wiring layers formed on insulative substrates.

As seen from the above description, the semiconductor substrate stacking method in accordance with the present invention is characterized by previously fabricating as an elementary stacking unit a thin film device having connection electrodes formed on two principal surfaces thereof, namely, an upper surface and an undersurface of the device, and by sequentially stacking the elementary stacking thin film devices on a basic layer thin film device formed on a base substrate. Therefore, it is not necessary to polish or grind a semiconductor substrate having the stacked device layers, and accordingly, there is no problem in which a stress acts on the connection electrode for interconnecting the stacked devices when the substrate is polished or ground.

In the semiconductor substrate stacking method in accordance with the present invention, the thin film device preparation process and the thin film device stacking process are completely separated from each other. Therefore, it is possible to perform, in parallel, designs of systems, circuits and masks for a plurality of devices, and the thin film device preparation process for each device, and thereafter to sequentially stacking the thin film devices thus prepared, in accordance with the thin film device stacking process. Therefore, since a portion of required processings can be performed in parallel, even if the number of the stacked layers is increased, there is not possibility that a turn around time (TAT) is extremely increased.

The invention has thus been shown and described with reference to the specific embodiments. However, it should be noted that the present invention is in no way limited to the details of the illustrated structures but changes and modifications may be made within the scope of the appended claims.

I claim:

1. A semiconductor substrate stacking method comprising the steps of:
    preparing first and second thin film devices each in the form of a thin film having an upper surface connection electrode formed on an upper surface thereof and an undersurface connection electrode formed on an undersurface thereof, each of the thin film devices being bonded at its upper surface thereof to a support plate by adhesive;
    stacking and bonding the first thin film device onto a base substrate having a device formed thereon and a connection electrode formed on the device, in such a manner that the device formed on the base substrate faces the undersurface of the first thin film device and the connection electrode formed on the device formed on the base substrate is in alignment with and in contact with the undersurface connection electrode formed on the first thin film device;
    removing the support plate and the adhesive of the first thin film device so that the upper surface of the first thin film device and the upper surface connection electrode formed on the the upper surface of the first thin film device are exposed;
    stacking and bonding the second thin film device onto the first thin film device stacked on the base substrate, in such a manner that the device formed on the first thin film device faces the undersurface of the second thin film device and the upper surface connection electrode formed on the device formed on the first thin film device is in alignment with and in contact with the undersurface connection electrode formed on the second thin film device; and
    removing the support plate and the adhesive of the second thin film device so that the upper surface of the second thin film device and the upper surface connection electrode formed on the the upper surface of the second thin film device are exposed.

2. A semiconductor substrate stacking method claimed in claim 1 wherein the preparation of each of the first and second thin film devices includes the steps of:
    forming a device on a semiconductor substrate;
    forming the upper surface connection electrode on an upper surface of the device formed on the semiconductor substrate;
    bonding the support plate, by adhesive, on the upper surface of the device formed on the semiconductor substrate and the upper surface connection electrode formed on the upper surface of the device formed on the semiconductor substrate;
    thinning the semiconductor substrate by removing the semiconductor substrate from an undersurface of the semiconductor substrate so as to form the thin film device composed of a remaining portion of the substrate in which the device is formed;
    forming an undersurface insulative layer on an undersurface of the thin film device; and
    forming an opening in the undersurface insulative layer; and
    forming the undersurface connection electrode on the undersurface of the thin film device exposed within the opening.

3. A semiconductor substrate stacking method claimed in claim 2 wherein the upper surface connection electrode formed on the upper surface of the device formed on the semiconductor substrate is formed of a refractory metal, and the undersurface connection electrode formed on the undersurface of the thin film device is formed of a non-refractory metal.

4. A semiconductor substrate stacking method claimed in claim 3 wherein the opening formed in the undersurface insulative layer formed on the undersurface of the thin film device is larger in size than a corresponding upper surface connection electrode, so that the nonrefractory metal filled in the opening forms a metal pool.

5. A semiconductor substrate stacking method claimed in claim 4 wherein the bonding of the first thin film device onto the base substrate is performed by heating the first thin film device and the base substrate to a temperature higher than a melting point of the non-refractory metal.

6. A semiconductor substrate stacking method as claimed in claim 4 wherein the removal of the support plate and the adhesive of the first thin film device is performed by etch-removing the support plate and then chemically removing the adhesive.

* * * * *